United States Patent [19]

Demazeau et al.

[11] Patent Number: 5,006,318

[45] Date of Patent: Apr. 9, 1991

[54] PARTICULATE COMPOSITIONS OF RARE EARTH OXIDE AND METHOD OF MAKING SAME

[75] Inventors: Gérard Demazeau, Gradignan; Olivier Martel, Grande-Synthe; Michel Devalette, Gradignan; Eric Verdon, St. Jean d'Angely, all of France

[73] Assignee: Rhone-Poulenc Chimie, Courbevoie, France

[21] Appl. No.: 108,903

[22] PCT Filed: Jan. 22, 1987

[86] PCT No.: PCT/FR87/00024

§ 371 Date: Nov. 13, 1987

§ 102(e) Date: Nov. 13, 1987

[87] PCT Pub. No.: WO87/04420

PCT Pub. Date: Jul. 30, 1987

[30] Foreign Application Priority Data

Jan. 22, 1986 [FR] France .................................. 86 00855

[51] Int. Cl.$^5$ ............................................. C01F 17/00
[52] U.S. Cl. .................................... 423/21.1; 423/263; 23/305 RF; 23/295 R; 156/623 R; 156/DIG. 63
[58] Field of Search ............................ 423/21.1, 263; 23/305 RE, 295 R; 156/623 R, DIG. 63; 501/152

[56] References Cited

U.S. PATENT DOCUMENTS

| 3,098,708 | 7/1963 | Foos | 423/11 |
| 3,271,114 | 9/1966 | Kolb | 156/623 R |
| 4,512,846 | 4/1985 | Schlichta | 23/295 R |
| 4,545,923 | 10/1985 | Gradeff et al. | 252/309 |
| 4,599,270 | 7/1986 | Rangaswamy et al. | 501/152 X |
| 4,661,330 | 4/1987 | Chane-Ching et al. | 423/263 |
| 4,755,492 | 7/1988 | Greskovich et al. | 501/152 X |
| 4,845,056 | 7/1989 | Yamanis | 501/152 X |

FOREIGN PATENT DOCUMENTS 0097563 1/1984 European Pat. Off.
0153227 8/1985 European Pat. Off.

OTHER PUBLICATIONS

C. B. Finch and G. W. Clark, *Journal of Crystal Growth*, 12, No. 2, pp. 181–182 (1972).

Primary Examiner—Brooks H. Hunt
Assistant Examiner—Ngoclan T. Mai
Attorney, Agent, or Firm—Burns, Doane, Swecker & Mathis

[57] ABSTRACT

Particulate compositions of rare earth oxides wherein the particles are present in the form of single crystals of homogeneous size and morphology, the dimensions of which are less than or equal to 10 μm and greater than approximately 0.05 μm and that at least 80% of the particles have dimensions varying within a range of x±0.2 x, x being the mean dimension of the particles of the composition under consideration, with the understanding that the variation of the range of ±0.2 x is not less than ±0.1 μm.

40 Claims, No Drawings

PARTICULATE COMPOSITIONS OF RARE EARTH OXIDE AND METHOD OF MAKING SAME

The object of the present invention consists of novel particulate compositions of rare earth oxide, their preparation and their application.

BACKGROUND OF THE INVENTION

It is known that the obtention of high purity oxides in a finely divided form constitutes an important research objective in different technical fields, to prepare for example ceramics, abrasives, catalyst supports, etc. . . .

It is known that rare earths are present in numerous minerals and constitute by-products of the preparation of various metals. Their utilization poses difficult technical and economic problems. In effect, the conventional methods of the processing of oxide particles generally employ either precipitation processes or those of the sol-gel type. In precipitation methods, the addition of the precipitating agent leads to contamination and thus a change in the purity of the oxide obtained. In the sol-gel methods, processing is generally long and the basic products used are expensive.

Furthermore, the calcination processes which generally represent the final stage in the obtention of oxides introduce the risk of additional pollution by the environment and lead to particles the surface whereof are less than favorable for certain applications.

In U.S. Pat. No. 3,098,708, the obtention of particles of oxides of thorium and uranium by a hydrothermal process consisting of heating an acid solution such as a hydrochloric or sulfuric acid solution of oxides of these metals to a temperature of 170° to 250° C., under a pressure of 100 to 400 psi (approximately $6.5 \times 10^5$ to $2.6 \times 10^6$ Pa), is described. In this patent, it is indicated that the process is of interest in particular because the rare earths potentially present do not precipitate during the carrying out of this hydrothermal process.

SUMMARY OF THE INVENTION

It has now been discovered that it is possible to obtain fine particles of a rare earth oxide in the form of microcrystallites, the size and morphology thereof may be controlled, by a solvothermal process consisting of heating the solvent medium under conditions of temperature and pressure corresponding to the hypercritical range. This process has made it possible to obtain for the first time rare earth oxides in the form of fine particles with dimensions of the order of microns having good homogeneity of the grain size distribution. These particles have a monocrystal configuration and in particular are free of internal porosity.

DETAILED OF THE INVENTION

It was discovered further that it is possible with the aid of the appropriate additives to direct the reaction so as to obtain grains the morphology thereof may vary as a function of the additive used.

The object of the present invention therefore consists of novel particulate compositions of rare earth oxides, characterized in that the particles are present in the form of single crystals with a homogeneous grain size and morphology, the dimensions whereof are smaller than or equal to 10 μm and greater than approximately 0.05 μm, and that at least 80% of the particles have dimensions varying within a range of $x \pm 0.2 \, x$, x being the mean dimension of the particles of the composition involved, it being understood that the range of variation $\pm 0.2 \, x$ is not less than $\pm 0.1$ μm.

The latter condition thus signifies that for compositions with particles having mean dimensions less than or equal to 0.5 μm, at least 80% of the particles have dimensions varying within a range of $x \pm 0.1$ μm. For compositions with particles having a mean dimension greater than or equal to approximately 2 μm, the process described hereinbelow makes it possible to obtain variations within a range of $x \pm 0.1 \, x$ for at least 80% of the particles.

Due to the process of the invention, the size of the particles may be controlled and it is possible to readily obtain particulate compositions having a mean particles dimension less than for example 2.5 μm, or less than or equal to 1 μm, or even less than or equal to 0.5 μm.

The particles of the compositions of the invention generally have dimensions less than or equal to 0.1 micrometers.

The microcrystalline stage is characterized in that the periodicity of the arrangement of the atoms constituting the material and being characteristic of the structure of the oxide under consideration, is continuous throughout the particle.

The microcrystalline quality may be determined on the one hand by a conventional X ray diffraction method applied to the crystal (for the coarser crystals), and on the other, by a high resolution electronic microscopy (for the smaller crystals).

In the present application, the "rare earths" are the lanthanides and yttrium.

In particular, the compositions of the invention are compositions based on yttrium, lanthanum, cerium, praseodymium, terbium, gadolinium, neodymium, ytterbium, europium, lutecium, etc. . . . oxides.

The following are cited among the particulate oxides according to the invention: the oxides $CeO_2$, $PrO_2$, $TbO_2$, $Nd_2O_3$, $Yb_2O_3$, $Y_2O_3$, etc. . . .

As indicated above, the process of the invention makes it possible to control the growth of the microcrystals to obtain particles with specific morphologies.

For example, in the case of $CeO_2$, it is possible to obtain either particles having a quasi-spherical configuration, which may be used particularly for the preparation of ceramics, or particles with sharp edges having the shape of pseudo-octahedrons, which are suitable for use in particular in the preparation of abrasives or catalyst supports.

A further object of the invention consists of a process of the preparation of particulate compositions as defined hereinabove.

This process is principally characterized by the fact that as the initial product a source of rare earths in a liquid medium is employed, that said initial product is heated in an enclosure to a temperature and a pressure at least equal to the critical temperature and the critical pressure of said medium, or a temperature and/or a pressure less than but very close to the critical values, said course of rare earths being capable of converting to the oxide at that temperature, that said temperature is maintained for a sufficient time, that the reaction mixture is cooled rapidly to a temperature less than 100° C. and returned to the atmospheric pressure, whereupon the microcrystals obtained are separated from the liquid medium.

The time during which the reaction medium is maintained at a temperature at least close to the critical temperature is a period of time sufficient to obtain particles having the characteristics desired. This time may be determined in each case by simple routine tests and it depends in particular on the temperature chosen. It varies generally between approximately 10 min and 1 h.

The source of rare earth may be derived from a rare earth capable of decomposing in or reacting with the liquid medium, to form the oxide corresponding to the reaction temperature. As the source of rare earths, in particular salts such as the nitrates may be cited. Other mineral salts, such as the chlorides, may also be used in the presence of nitric acid. Organic salts, such as acetates or oxalates, may also be used as the source of rare earths. Among the other sources of the rare earths, for example freshly precipitated hydroxides may be cited.

The liquid medium used may be any liquid that does not react with rare earth oxides under the temperature and pressure conditions applied. The liquid medium must dissolve the source of rare earths, not necessarily at the ambient pressure, but at least at the pressure of the reaction. It is known in effect that the solubility increases together with the pressure, and thus it is possible to use as the initial product suspensions of insoluble salts, such as oxalates, the dissolution at elevated pressures whereof is sufficient to permit the growth of microcrystals from the crystalline nuclei of the oxide formed.

It should be noted further that the use of elevated pressures favors the solubilization of the initial product, thus favoring the formation a larger number of crystalline nuclei of the oxide.

The concentration of the source of lanthanide is preferably equal to at least 1 mole/liter. The only upper limit of the concentration is the solubility limit of the source of lanthanide under the conditions of temperature and pressure used.

Among the suitable liquids, in particular water, lower alcohols such as methanol, ethanol, isopropanol, carbonyl derivatives such as acetone, anhydride or acid solutions (for example solutions of HCl, $SO_2$, $NO_3H$, $CH_3COOH$, etc. ...) and their mixtures, may be cited. The operation is generally carried out in an acid medium, specifically a buffered acid medium.

The use of different solvent media or their mixtures makes it possible to vary the critical temperature and pressure.

If the rare earth has several possible degrees of oxidation, the addition of oxidizing-reducing agents in the form soluble in the medium, makes possible if so desired, the obtention of a particular oxide. It should be noted in this connection that in the case in which the source of the rare earth is a nitrate, the nitrate ion behaves as an oxidant. For example, if one starts from cerium III nitrate, as the final product cerium IV oxide ($CeO_2$) is obtained without the need for the addition of an oxidizing agent.

The operation is carried out generally at a temperature higher than 100° C., for example at temperatures of 200° to 600° C., and at pressures higher than 40 bar, for example at pressures of 50 to 2000 bar. It is recalled that a bar corresponds to a pressure of $10^5$ Pa.

A rise in the reaction temperature increases the size of the oxide crystallites, together with their crystallinity.

The rate of the rise in temperature may be variable and depends on the thermal inertia of the system. A relatively rapid rise in temperature favors the obtention of a good homogeneity of the size of the microcrystallites. For example, the rise in temperature may vary from 10° C. to 50° C./min.

It is possible for example to operate by introducing the initial product (solution or suspension) into an autoclave the walls whereof do not react with the liquid medium used. If so desired, an additional initial pressure may be applied, which is then added to the pressure resulting from the heating of the enclosed medium.

For the preparation of small quantities, the initial product may be introduced into a deformable enclosure capable of transmitting pressure variations, and the enclosure placed into an autoclave filled with a liquid, which transmits both the heat and the pressure required.

The duration of the process generally does not exceed 30 min.

It was discovered further that the addition to the initial product of small quantities of ionic species makes it possible to control the growth of crystals and to regulate the morphology of the microcrystallites of the rare earth oxide obtained. For example, in the case of cerium oxide, the addition to the initial product of fluoride ions leads to the obtention of particles of a spheroidal shape similar to those obtained by the decomposition of $Ce^{+IV}$ nitrates in the absence of anionic additive. In contrast, the addition of ions, such as carbonate or hydrogenocarbonate, chloride, acetate ions, leads to sharp edged particles of a pseudo-octahedral shape.

The morphology modifying ions (anions, cations) may be added in the form of acids or preferably of the corresponding salts. The anion used may be any anion which does not yield with the rare earth present a salt that is more insoluble than the oxide of this rare earth. Preferably, the modifying agents are added in a soluble form and are chosen so that they do not form an insoluble salt with the rare earth under consideration.

The anions are added for example in the form of an alkaline or alkaline earth salt. The addition of such salts does not cause a detectable contamination of the microcrystallites obtained. A near-totality of the additive is recovered in the solution following the separation of the microcrystallites at the completion of the process. The modifying ions are added for example in a proportion of 1 to 10% in moles relative to the number of atoms of the rare earth. Experiments performed did not discover appreciable differences between the effects obtained with the lowest concentration of 1% and the highest of 10%.

The utilization of the particulate compositions of rare oxides as defined hereinabove is also an object of the invention, in particular in the preparation of ceramics, abrasive agents, catalysts, catalyst supports, etc. ...

The following examples illustrate the invention without limiting it.

EXAMPLE 1

A 1.8 M aqueous solution of cerium $^{+IV}$ nitrate is introduced in a gold tube, which is sealed.

The tube is placed into an autoclave equipped with a device making it possible to vary the pressure. The autoclave is filled with water employed as a transmitter of heat and pressure. The tube is exposed to a pressure of 1 kilobar ($10^8$ Pa), at a temperature of 400° C. for 30 min. The rise in temperature was of the order of 20° C./min. After 30 min, the autoclave is cooled rapidly to 40° C. so as to effect quenching. After returning to atmosphering pressure, the tube is extracted from the enclosure and it is found that the reaction mixture contains a finely divided solid phase. Analysis of the solid phase by X ray diffraction shows that it consists exclusively of $CeO_2$ microcrystallites. Analysis by scanning electron microscopy shows that the mean size of particles is 0.3 μm with a good homogeneity (higher than 80%) of grain size distribution between 0.2 and 0.4 μm.

EXAMPLE 2

As the initial product of 1.8 M aqueous solution of cerium $+III$ nitrate is used; it is exposed to the operating conditions of Example 1.

Fine particles consisting of $CeO_2$ in the form of octahedrons are obtained.

The mean dimension of the particles is 0.2 μm.

The study of the images obtained by scanning electron microscopy shows that more than 80% of the particles have a dimension between 0.1 and 0.3 μm.

EXAMPLE 3

To a 1.8 M aqueous solution of cerium $+IV$ nitrate, 5 mole % of NaF relative to the number of moles of cerium are added. This solution is treated as described in Example 1. Grains with isotropic configuration are obtained. The study of scanning electron microscope images shows a great homogeneity of size (between 0.1 and 0.3 μm) and shape of the grains. The mean dimension of the particles is equal to approximately 0.2 μm.

EXAMPLE 4

The solution of Example 1 is used as the initial product, but sodium carbonate is added in a proportion of 5 mole % relative to the number of cerium moles. The operating conditions are those described in Example 1.

$CeO_2$ microcrystallites in the form of pseudo-octahedrons with sharp edges and with a mean dimension of 2 μm, are obtained, with more than 80% of the particles having dimensions between 1.8 and 2.2 μm.

EXAMPLE 5

The initial solution is that of Example 1, but 5 mole % sodium chloride (relative to the number of cerium moles) are added. Under the experimental conditions of Example 1 $CeO_2$ crystallites of an octahedral shape are obtained, said crystallites having mean dimensions of 1.5 μm, with more than 80% of the particles having dimensions between 1.2 and 1.8 μm.

EXAMPLE 6

The solution of Example 1 is used and 5 mole % sodium acetate are added. Following the treatment described in Example 1, sharp edged microcrystallites of a homogeneous size (more than 80% of the particles have dimensions between 1.2 and 1.8 μm) are obtained; the mean particle size is 1.5 μm.

EXAMPLE 7

A solution similar to that of Example 1 is used as the initial product, but 5 mole % sodium hydrogenocarbonate are added.

$CeO_2$ microcrystallites in the form of octahedrons of homogeneous size (0.2-0.4 μm for more than 80% of the particles). Mean size: 0.3 μm.

We claim:

1. Particulate compositions of rare earth oxides comprising particles present in the form of single crystals of homogeneous size and morphology, the dimensions of the single crystals being less than or equal to 10 μm and greater than approximately 0.05 μm and at least 80% of the particles having dimensions varying within a range of $x \pm 0.2$ x, x being the mean dimension of the particles of the composition under consideration, with the understanding that the variation of the range of $\pm 0.2$ x is not less than $\pm 0.1$ μm.

2. Composition according to claim 1, characterized in that the particles have a mean dimension greater than or equal to 2 μm, and that at least 80% of the particles have dimensions varying with $x \pm 0.1$ x.

3. Compositions according to claim 1, characterized in that the rare earth oxide is chosen from among the oxides of yttrium, lanthanum, cerium, praseodymium, terbium, gadolinium, neodymium, ytterbium or europium.

4. Compositions according to claim 3, characterized in that the rare earth oxide is $CEO_2$.

5. Compositions according to claim 4, characterized in that said particles have substantially quasi-spherical or pseudo-octahedral shapes.

6. Compositions according to claim 2, characterized in that the rare earth oxide is chosen from among the oxides of yttrium, lanthanum, cerium, praseodymium, terbium, gadolinium, neodymium, ytterbium or europium.

7. Process for the preparations of a composition of rare earth oxides including particles present in the form of single crystals of homogeneous size and morphology, the dimensions of the single crystals are less than or equal to 10 μm and greater than approximately 0.05 μm and that at least 80% of the particles have dimensions varying within a range of $x \pm 0.2$ x, x being the mean dimension of the particles of the composition under consideration, with the understanding that the variation of the range of $\pm 0.2$ x is not less than $\pm 0.1$ μm comprising the steps of using as the initial product a source of rare earth in a liquid medium, heating said initial product in a tight enclosure to a temperature and pressure at least equal respectively to the critical temperature and pressure of said medium, or to a temperature and/or pressure less than but very near to said critical values, said source of rare earth being capable of converting into the oxide at this temperature, maintaining said temperature for a sufficient time to obtain particles in the form of said single crystals, cooling the reaction medium rapidly to a temperature less than 100° C. and returning the reaction medium to atmospheric pressure, whereupon the single crystals obtained are separated from the liquid medium.

8. Process according to claim 7, characterized in that source of rare earth is chosen from among nitrates, other mineral salts in the presence of nitric acid, organic salts and hydroxides.

9. Process according to claim 7, characterized in that the heating is effected with a temperature rise rate of 10° to 50° C. per minute.

10. Process according to claim 7, characterized in that the liquid medium is chosen from among water, the lower alcohols, carbonyl derivatives, solutions of anhydrides or acids, and their mixtures.

11. Process according to claim 7, characterized in that the operation is carried out at temperatures between 200° to 600° C., and at pressures higher than 40 bar ($4 \times 10^6$ Pa).

12. Process according to claim 7, characterized in that in order to favor the obtention of a particular morphology of the particles, to the initial product small quantities of ionic species are added.

13. Process according to claim 7, characterized in that the time during which the reaction mixture is maintained at a temperature at least near the critical temperature, varies from 10 min to approximately 1 hr.

14. Process according to claim 8, characterized in that the heating is effected with a temperature rise rate of 10 to 50° C. per minute.

15. Process according to claim 8, characterized in that the liquid medium is chosen from among water, the lower alcohols, carbonyl derivatives, solutions of anhydrides or acids, and their mixtures.

16. Process according to claim 8, characterized in that the operation is carried out at temperatures between 200 to 600° C., and at pressures higher than 40 bar ($4 \times 10^6$ Pa).

17. Process according to claim 8, characterized in that in order to favor the obtention of a particular morphology of the particles, to the initial product small quantities of ionic species are added.

18. Process according to claim 8, characterized in that the time during which the reaction mixture is maintained at a temperature at least near the critical temperature, varies from 10 min to approximately 1 h.

19. Process according to claim 9, characterized in that the liquid medium is chosen from among water, the lower alcohols, carbonyl derivatives, solutions of anhydrides or acids, and their mixtures.

20. Process according to claim 9, characterized in that the operation is carried out at temperatures between 200 to 600° C., and at pressures higher than 40 bar ($4 \times 10^6$ Pa).

21. Process according to claim 9, characterized in that in order to favor the obtention of a particular morphology of the particles, to the initial product small quantities of ionic species are added.

22. Process according to claim 9, characterized in that the time during which the reaction mixture is maintained at a temperature at least near the critical temperature, varies from 10 min. to approximately 1 h.

23. Process according to claim 10, characterized in that the operation is carried out at temperatures between 200 to 600° C., and at pressures higher than 40 bar ($4 \times 10^6$ Pa).

24. Process according to claim 10, characterized in that in order to favor the obtention of a particular morphology of the particles, to the initial product small quantities of ionic species are added.

25. Process according to claim 10, characterized in that the time during which the reaction mixture is maintained at a temperature at least near the critical temperature, varies from 10 min to approximately 1 h.

26. Process according to claim 11, characterized in that in order to favor the obtention of a particular morphology of the particles, to the initial product small quantities of ionic species are added.

27. Process according to claim 11, characterized in that the time during which the reaction mixture is maintained at a temperature at least near the critical temperature, varies from 10 mix to approximately 1 h.

28. Process according to claim 12, characterized in that said ionic species are added in the form of acids or their salts, in a proportion of 1 to 10 mole % relative to the number of rare earth atoms.

29. Process according to claim 12, characterized in that the modifying ions are added in the form of alkaline or alkaline earth salts.

30. Process according to claim 12, characterized in that the modifying ions are chosen from among fluorides, chlorides, carbonates, hydrogenocarbonates and acetates.

31. Process according to claim 12, characterized in that the time during which the reaction mixture is maintained at a temperature at least near the critical temperature, varies from 10 min to approximately 1 h.

32. Process according to claim 28, characterized in that the modifying ions are added in the form of alkaline or alkaline earth salts.

33. Process according to claim 28, characterized in that the time during which the reaction mixture is maintained at a temperature at least near the critical temperature, varies from 10 min to approximately 1 h.

34. Process according to claim 29, characterized in that the modifying ions are chosen from among fluorides, chlorides, carbonates, hydrogenocarbonates and acetates.

35. Process according to claim 29, characterized in that the time during which the reaction mixture is maintained at a temperature at least near the critical temperature, varies from 10 min to approximately 1 h.

36. Process according to claim 30, characterized in that the time during which the reaction mixture is maintained at a temperature at least near the critical temperature, varies from 10 to approximately 1 h.

37. Process for the preparation of a composition of rare earth oxides including particles present in the form of single crystals of homogeneous size and morphology, the dimensions of the single crystals are less than or equal to 10 μm and have a mean dimension greater than or equal to 2 μm and that at least 80% of the particles have dimensions varying within a range of x±0.1 x, x being the means dimension of the particles of the composition under consideration, with the understanding that the variation of the range of ±0.1 x is not less than ±0.1 μm comprising the steps of using as the initial product a source of rare earth in a liquid medium, heating said initial product in a tight enclosure to a temperature and pressure at least equal respectively to the critical temperature and pressure of said medium, or to a temperature and/or pressure less than but very near to said critical values, said source of rare earth being capable of converting into the oxide at this temperature, maintaining said temperature for a sufficient time to obtain particles sin the form of said single crystals, cooling the reaction medium rapidly to a temperature less than 100° C. and returning the reaction medium to atmospheric pressure, whereupon the single crystals obtained are separated from the liquid medium.

38. Process for the preparation of a composition of rare earth oxides chosen from among the oxides of yttrium, lanthanum, cerium, praseodymium, terbium, gadolinium, neodymium, ytterbium or europium including particles present in the form of single crystals of homogeneous size and morphology, the dimensions of the single crystals are less than or equal to 10 μm and greater than approximately 0.05 μm and that at least 80% of the particles have dimensions varying within a range of x±0.2 x, x being the mean dimension of the particles of the composition under consideration, with the understanding that the variation of the range of ±0.2 x is not less than ±0.1 μm comprising the steps of using as the initial product a source of rare earth in a liquid medium, heating said initial product in a tight enclosure to a temperature and pressure at least equal respectively to the critical temperature and pressure of said medium, or to a temperature and/or pressure less than but very near to said critical values, said source of rare earth being capable of converting into the oxide at this temperature, maintaining said temperature for a sufficient time to obtain particles in the form of said single crystals, cooling the reaction medium rapidly to a temperature less than 100° C. and returning the reaction medium to atmospheric pressure, whereupon the single crystals obtained are separated from the liquid medium.

39. Process for the preparation of a composition cerium oxide including particles present in the form of single crystals of homogeneous size and morphology, the dimensions of the single crystals are less than or equal to 10 μm and greater than approximately 0.05 μm and that at least 80% of the particles have dimensions varying within a range of x ±0.2 x, x being the mean dimension of the particles of the composition under consideration, with the understanding that the variation of the range of ±0.2 x is not less than ±0.1 μm comprising the steps of using, as the initial product source of rare earth in a liquid medium, heating said initial product in a tight enclosure to a temperature and pressure at least equal respectively to the critical temperature and pressure of said medium, or to a temperature and/or pressure less than but very near to said critical values, said source of rare earth being capable of converting into the oxide at this temperature, maintaining said temperature for a sufficient time to obtain particles in the form of said single crystals, cooling the reaction medium rapidly to a temperature less than 100° C. and returning the reaction medium to atmospheric pressure, whereupon the single crystals obtained are separated from the liquid medium.

40. Process for the preparation of a composition of cerium oxide including particles present in the form of single crystals of homogeneous size and morphology having substantially pseudo-spherical or pseudo-octahedral shapes, the dimensions of the single crystals are less than or equal to 10 μm and greater than approximately 0.05 μm and that at least 80% of the particles have dimensions varying within a range of x±0.2 x, x being the mean dimension of the particles of the composition under consideration, with the understanding that the variation of the range of ±0.2 x is not less than ±0.1 μm comprising the steps of using as the initial product a source of rare earth in a liquid medium, heating said initial product in a tight enclosure to a temperature and pressure at least equal respectively to the critical temperature and pressure of said medium, or to a temperature and/or pressure less than but very near to said critical values, said source of rare earth being capable of converting into the oxide at this temperature, maintaining said temperature for a sufficient time to obtain particles in the form of said single crystals, cooling the reaction medium rapidly to a temperature less than 100° C. and returning the reaction medium to atmospheric pressure, whereupon the single crystals obtained are separated from the liquid medium.

* * * * *